United States Patent [19]

DeWilde

[11] Patent Number: 5,172,305
[45] Date of Patent: Dec. 15, 1992

[54] CIRCUIT BOARD ENCLOSURE WITH DISPLACEABLE POWER SUPPLY

[75] Inventor: Mark A. DeWilde, Freeville, N.Y.

[73] Assignee: Ironics, Inc., Ithaca, N.Y.

[21] Appl. No.: 741,373

[22] Filed: Aug. 7, 1991

[51] Int. Cl.$^5$ .............................................. H05K 7/14
[52] U.S. Cl. .................................. 361/415; 361/340; 361/391; 361/413
[58] Field of Search ............... 361/334, 340, 390, 391, 361/392, 393, 395, 396, 413, 415; 248/455; 174/51

[56] References Cited

U.S. PATENT DOCUMENTS

| | | | |
|---|---|---|---|
| 3,679,829 | 7/1972 | Hofmeister et al. | 361/390 |
| 4,080,644 | 3/1978 | Reed et al. | 174/51 |
| 4,731,703 | 3/1988 | Tsukaguchi et al. | 361/391 |
| 5,032,952 | 7/1991 | Cooke et al. | 361/392 |

Primary Examiner—Leo P. Picard
Assistant Examiner—D. Sparks
Attorney, Agent, or Firm—Salzman & Levy

[57] ABSTRACT

The present invention features a circuit board enclosure assembly for housing a power supply and circuit boards in operative juxtaposition. A housing has a power supply access portion comprising an opening in a top portion thereof covered by a lid. An interior portion of the housing supports the power supply and the circuit board cage. The cage has a plurality of slots supporting the circuit boards. The power supply is operatively connected to the plurality of circuit boards, and is pivotably mounted upon the housing by means of a pair of hinges disposed adjacent the power supply access portion. This allows for easy accessing and substantial removal of the power supply from the interior portion of the housing, while maintaining operative connection with the plurality of circuit boards.

3 Claims, 6 Drawing Sheets

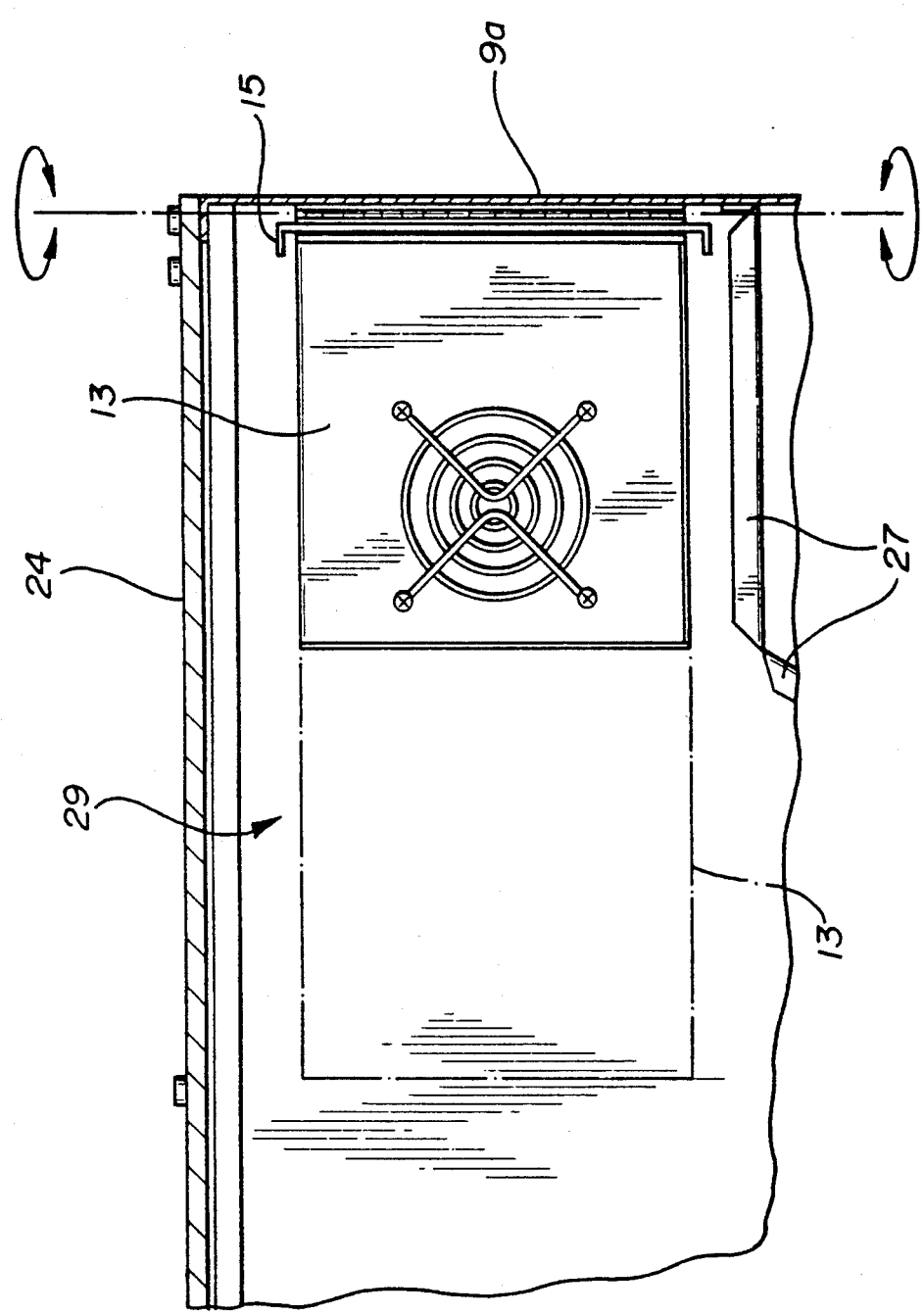

CIRCUIT BOARD ENCLOSURE WITH DISPLACEABLE POWER SUPPLY

The present invention relates to circuit board enclosures and, more particularly, to circuit board enclosures having accessible components.

BACKGROUND OF THE INVENTION

There is often a need to access certain parts of circuit board enclosures and components thereof as well as connectors. What has become an increasingly vexing problem is the necessity to access certain parts of these enclosures while power is supplied and the system continues to operate. Not only is it advantageous from the point of view of the operator or user to allow systems to continue to perform their intended operations without interruption, but it is often important for a repair person to analyze and diagnose anomalies in the system while under normal operating conditions.

Prior art systems show certain apparatuses for removing components or sections of the printed circuit board enclosures, but only at the expense of disconnecting the power supply from the rest of the system.

In U.S. Pat. No. 4,977,532, for example, not only is the power supply removed and disconnected from the system during circuit trouble shooting, but so too are the logic circuits, circuit boards, fans, etc. In fact, the conventional wisdom is to provide quick disconnects and locator pins to facilitate the assembly and disassembly of various components from the circuit board enclosure.

Conventionally, service personnel use jumper cables and wire harnesses to reconnect the power supply to the operating components of the system during a test. Such an operation, however, still requires removal of the lids or covers of the enclosures. Unfortunately, this sort of bypass of direct connections leads to electrical problems, shock hazards, noise, electromagnetic interference, RF interference and other altered electrical characteristics.

It is also very common to have to reconfigure a system depending on the types of boards used and the positions of the boards in the card cage relative to one another. Certain types of electrical devices such as shunts, jumper cables, I/O connectors, etc., must be set or adjusted in ways that make it extremely difficult for conventional systems to be so reconfigured. The present invention seeks to make possible the reconfiguring of a circuit board system without the need to utilize shunts, jumper cables, I/O connectors and other bypass equipment.

The geometry of conventional circuit board enclosure systems are such that their permanently attached power supplies have resulted in extreme repair and testing difficulties when the other parts or components of the system must be analyzed or accessed.

It is, of course, much easier to repair or replace a component or power supply that is easily accessible than to repair one that is permanently affixed, or buried beneath other components or hardware fixtures.

It would be advantageous to provide a system for mounting the power supply in such a way that it can be displaced, but not disconnected from the circuitry in the enclosure, for the purposes of cleaning, testing, or repair.

It would also be advantageous to provide a compact system having circuits with a high density of components packaged together with a sufficient power supply in a relatively small volume.

It would further be advantageous to provide such a compact system with the means to access all the parts of the enclosure during normal operations without the need to dismantle any of the components, circuits or power supplies.

In the present invention, the power supply itself be easily accessed, repaired or replaced. Moreover, this can be achieved without removing the power supply or any other components from the system. This provides the further advantage that other components in the enclosure can also be tested or accessed while the system is still operating. In other words, there is no need to disconnect the circuitry.

SUMMARY OF THE INVENTION

The invention features a circuit board enclosure assembly for housing a power supply and circuit boards in operative juxtaposition. A housing has a power supply access portion comprising an opening in a top portion thereof covered by a lid. An interior portion of the housing supports the power supply and the circuit board cage. The cage has a plurality of slots supporting the circuit boards. The power supply is operatively connected to the plurality of circuit boards, and is pivotably mounted upon the housing by means of a pair of hinges disposed adjacent the power supply access portion. The allows for easy accessing and substantial removal of the power supply from the interior portion of said housing, while maintaining operative connection with said plurality of circuit boards.

BRIEF DESCRIPTION OF THE DRAWINGS

A complete understanding of the present invention may be obtained by reference to the accompanying drawings, when considered in conjunction with the subsequent detailed description, in which:

FIG. 6 is an enlarged partial cross sectional view of yet another alternate embodiment of the power supply assembly.

DESCRIPTION OF THE PREFERRED EMBODIMENT

Generally speaking, the invention provides a circuit board enclosure assembly, wherein the power supply is mounted within a housing in juxtaposition to a circuit board cage. The power supply is pivotably movable with respect to the housing, such that it can be swung out of the housing without disconnecting it from the circuit boards. This unique arrangement allows the components of the circuit board enclosure assembly to be more easily accessed and tested in their operational capacities while still being connected electrically to the power supply.

For the purposes of clarity and brevity, like components and elements will bear the same designations throughout the figures.

Figure 1:
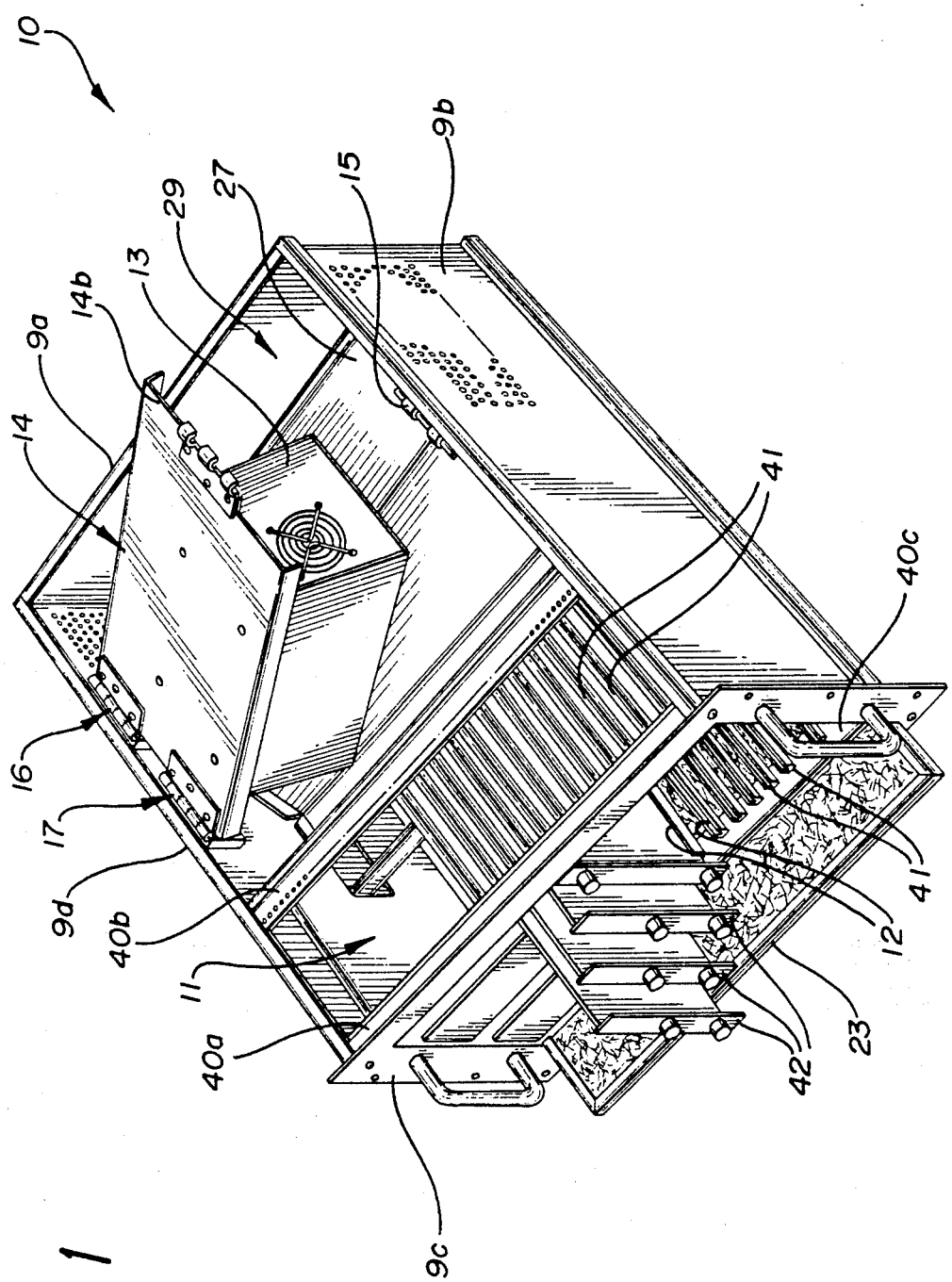
FIG. 1 is a perspective view of the circuit board enclosure assembly of present invention.

Now referring to FIG. 1, a circuit board enclosure assembly 10 is shown in perspective view. The circuit board enclosure assembly 10 comprises vertical walls 9a, 9b, 9c and 9d, respectively. Walls 9b and 9d are perforated on the rear face of assembly 10 for air to be provided to the system. A circuit board card cage 11 is shown supported by walls 9b and 9d, respectively. The circuit board card cage 11 has a number of slots 12 for supporting a plurality of circuit boards (not shown).

Figure 2:
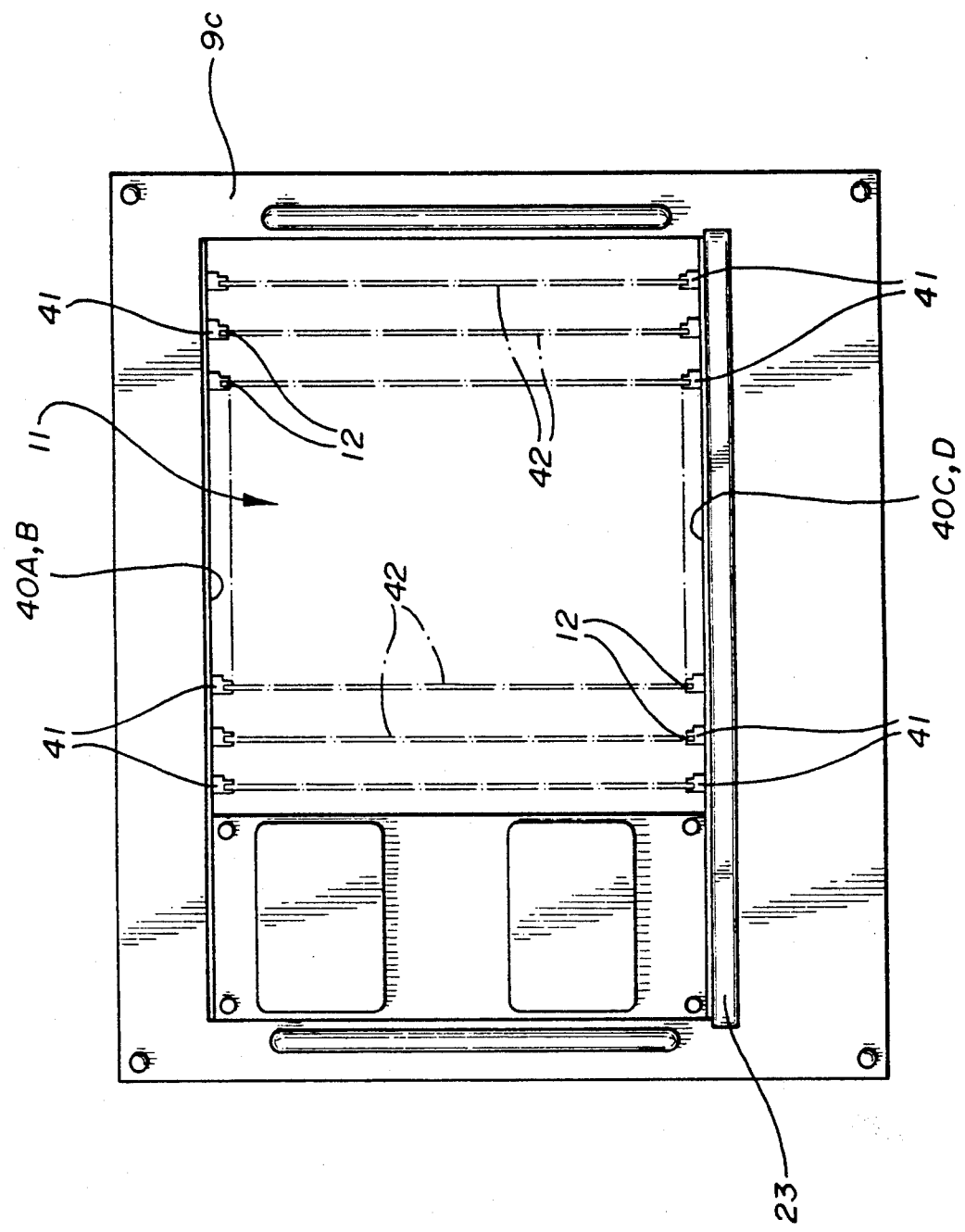
FIG. 2 is a front elevational view of the assembly of FIG. 1.

In card cage 11 are mounted two pairs of parallel rails 40a and 40b (top rails) and 40c and 40d (bottom rails) on which are mounted card guides 41 for receiving printed circuit boards 42, shown in phantom in FIG. 2.

Figure 4:
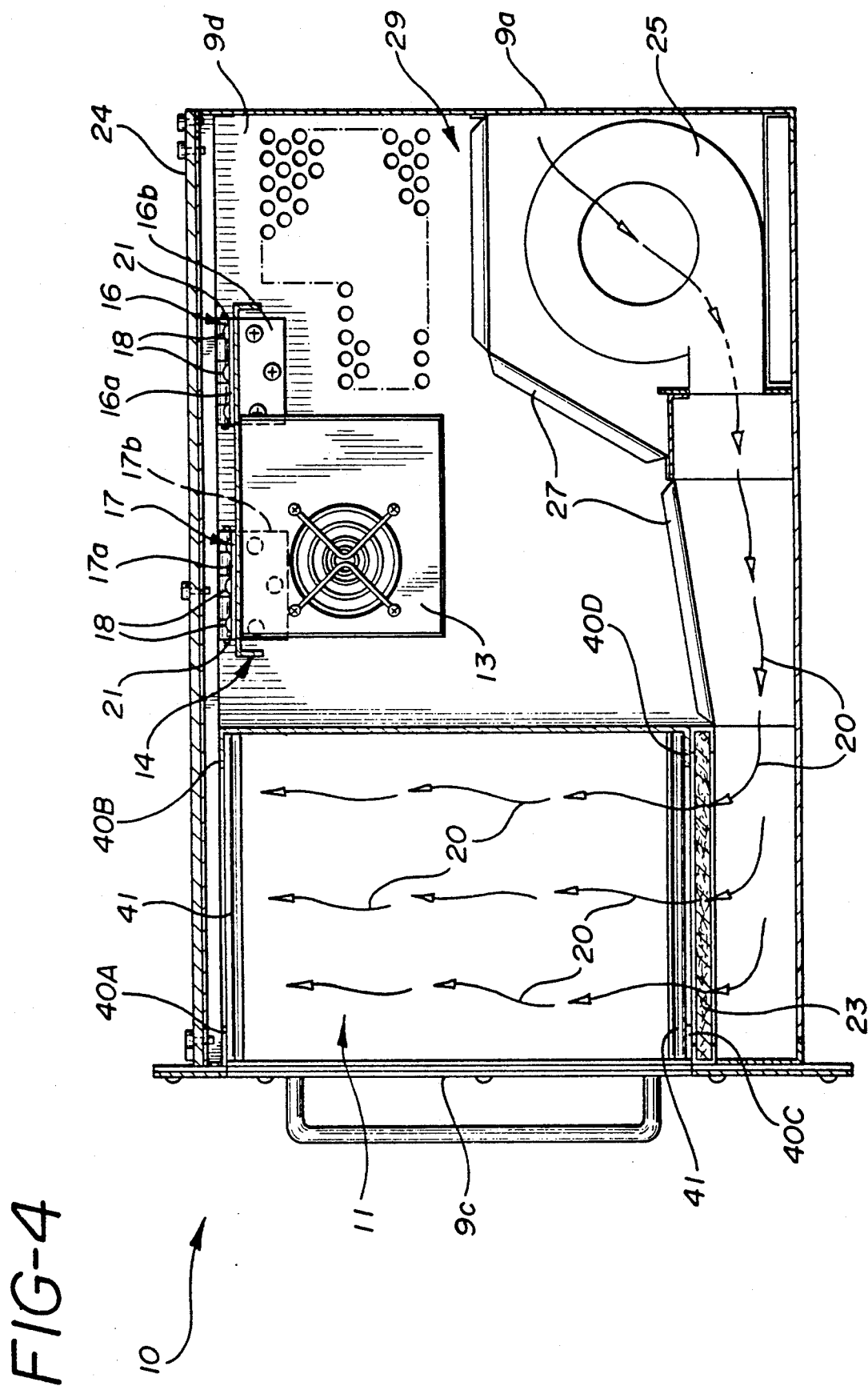
FIG. 4 is a cross sectional view taken along lines 4—4 of FIG. 3.

In the center of the circuit board enclosure assembly 10 is disposed a power supply 13 (shown in FIG. 4).

Figure 3:
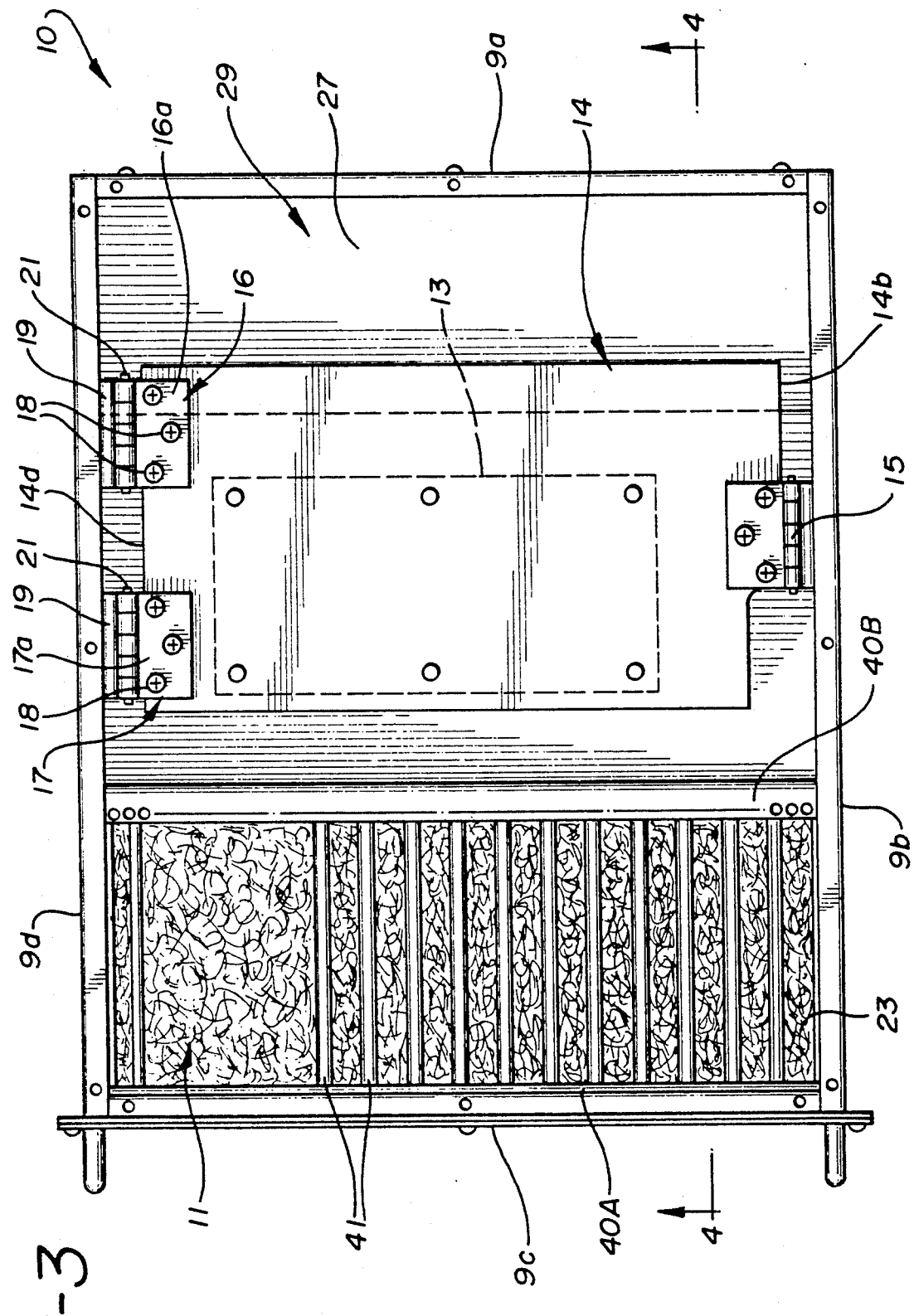
FIG. 3 is a top plane view of the assembly of FIG. 1.

Referring now also to FIG. 3, the power supply 13 is carried by a support platform 14. The right-hand end 14b of the support platform 14 rests upon, but is not necessarily secured to a mounting bracket 15. A temporary or easily removable fastener fastens end 14b to the mounting bracket 15. The mounting bracket 15 is affixed to vertical wall 9b.

The left-hand end 14d of support platform 14 is secured to a pair of spaced apart hinges 16 and 17, respectively. The platform 14 is secured to the horizontal hinge sections 16a and 17a, respectively, by means of screws 18, as shown. Each of the vertical sections 16b and 17b of hinges 16 and 17 (FIG. 4), are secured to a spacer 19 which is secured to left vertical wall 9d by screws (not shown). The hinge pins 21 allow the horizontal hinge sections 16a and 17a to pivot about left vertical wall 9d. Therefore, the platform 14 carrying the power supply 13 can be pivoted about hinge pins 21. Thus, the power supply 13 is able to swing out of the assembly housing 10 when platform end 14b is unsecured.

Referring to FIG. 4, a side view of the circuit board enclosure assembly 10 is illustrated. The enclosure assembly 10 houses a blower unit 25 that forces air (arrows 20) through plenum 27 to a filter 23, and upwardly therethrough to the card cage 11 in order to cool the circuit boards (not shown) housed in the card cage 11.

Above the plenum 27, within internal cavity 29 of housing 10, is mounted the power supply 13. Access to the power supply 13 is achieved by removing lid 24, normally attached to the upper portions of walls 9a-9d. The platform 14, being free to pivot about pivot pins 21 joining the first pair of hinge sections 16a and 16b and the second pair of hinge sections 17a and 17b, can then be swung upwardly through the opening vacated by lid 24. If electrical connections between power supply 13 and card cage 11 are disposed along left vertical wall 9d of housing 10, it can be seen that the power supply 13 can be displaced without disconnecting it.

Figure 5:
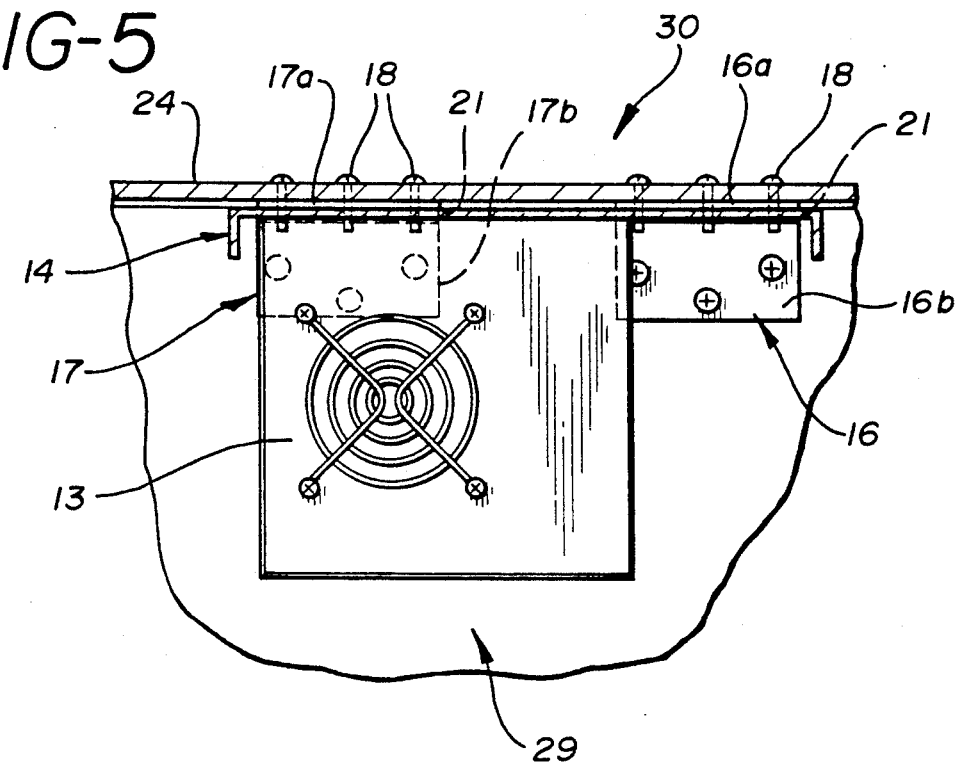
FIG. 5 is an enlarged partial cross sectional view of an alternate embodiment of the power supply assembly.
Figure 5A:
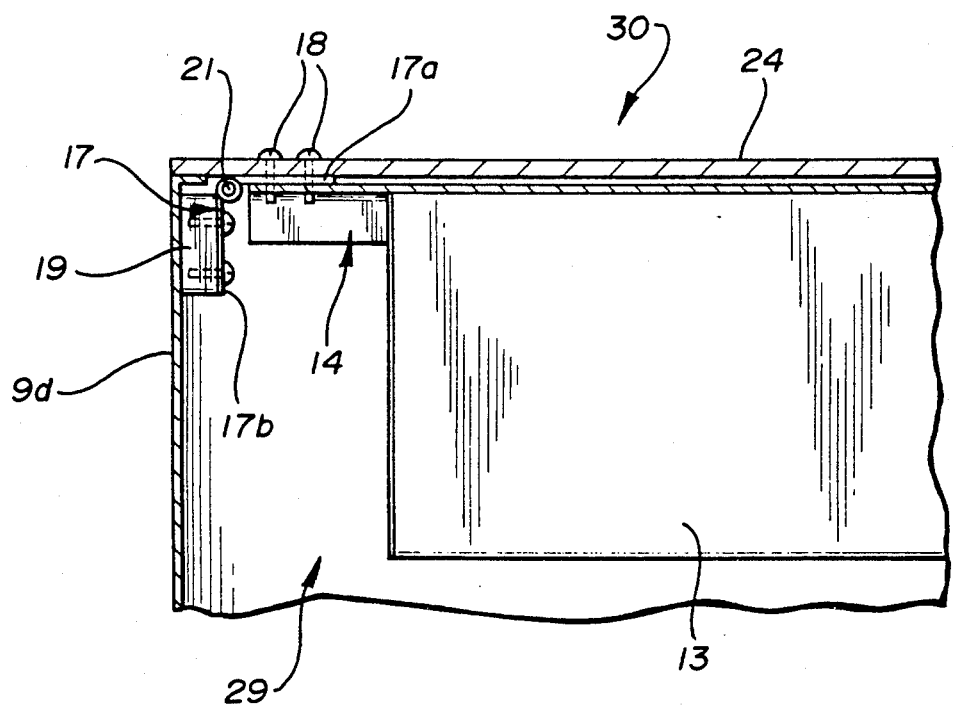
FIG. 5a is an enlarged partial side cross sectional view of FIG. 5.

Referring to FIG. 5, an alternate embodiment of the platform 14, is shown. In this embodiment, the platform 14 of FIG. 4 has been incorporated with the lid 24, to provide a platform and lid combination 30, as illustrated. In this embodiment, the lid/platform combination 30 is swung about hinge pins 21, thus lifting the power supply 13 out of internal cavity 29 of the housing 10.

Referring now to FIG. 6, there is shown another alternate embodiment depicting the mounting bracket 15 and power supply 13 combination reconfigured to other portions of the housing 10 (e.g., vertically affixed to the back vertical wall 9a of housing 10) without departing from the spirit of the present invention. In such cases, instead of swinging power supply 13 up and out of housing 10, it can be pivoted around a vertical axis and likewise out of housing 10.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Having thus described the invention, what is desired to be protected by Letter Patent is presented in the subsequently appended claims.

What is claimed is:

1. A circuit board enclosure assembly for housing a power supply and circuit boards in operative juxtaposition, comprising:
 a) a housing having means defining a power supply access portion and an interior portion for supporting a power supply and a circuit board cage;
 b) a circuit board cage disposed within said interior portion of said housing having means defining a number of slots for supporting a plurality of circuit boards;
 c) a power supply operatively connected to said plurality of circuit boards, and pivotably mounted upon said housing adjacent said power supply access portion for easily accessing and substantially removing said power supply from the interior portion of said housing, while maintaining operative connection with said plurality of circuit boards;
 d) a generally horizontally disposed platform for supporting said power supply on said housing, said platform supported by said housing and having a first end support and a second end support, the first and second end supports of the platform being on opposite sides of said platform, said platform being pivotably supported upon said housing on said first end support, and mountably supportable upon said housing on said second end support;
 e) hinging means affixed between said housing and said first end support of said platform for pivotably moving said platform supporting said power supply with respect to said housing; and
 f) mounting bracket means affixed to said housing and supporting said platform on said second end support
 g) means defining an opening in said housing adjacent said power supply and wherein said pivotable platform additionally defines a covering for said power supply, said platform having dimensions greater than said power supply and less than said opening.

2. The circuit board enclosure assembly for housing a power supply and circuit boards in operative juxtaposition in accordance with claim 1, wherein said hinging means comprises a pair of spaced apart hinges.

3. The circuit board enclosure assembly for housing a power supply and circuit boards in operative juxtaposition in accordance with claim 2, further comprising a hinge-like support affixed to said platform and supportable upon said mounting bracket means affixed to said housing, said hinge-like support being disposed opposite said pair of spaced apart hinges, for horizontally mounting said platform upon said housing.

* * * * *